(12) United States Patent
Jung et al.

(10) Patent No.: US 8,773,140 B2
(45) Date of Patent: Jul. 8, 2014

(54) SYSTEM AND METHOD FOR INSPECTION OF ELECTRICAL CIRCUITS

(75) Inventors: Sam-Soo Jung, San Jose, CA (US); Raul Martin, San Jose, CA (US)

(73) Assignee: Photon Dynamics, Inc, San Jose, CA (US)

( * ) Notice: Subject to any disclaimer, the term of this patent is extended or adjusted under 35 U.S.C. 154(b) by 239 days.

(21) Appl. No.: 13/190,926

(22) Filed: Jul. 26, 2011

(65) Prior Publication Data
US 2013/0027050 A1 Jan. 31, 2013

(51) Int. Cl.
*G01R 31/08* (2006.01)

(52) U.S. Cl.
USPC ..................... 324/527; 324/532; 324/750.01

(58) Field of Classification Search
USPC ................ 324/537, 750.02–750.13, 715, 718
See application file for complete search history.

(56) References Cited

U.S. PATENT DOCUMENTS

| | | | |
|---|---|---|---|
| 5,189,375 A * | 2/1993 | Tuttle | 324/537 |
| 5,781,017 A * | 7/1998 | Cole et al. | 324/754.22 |
| 2005/0182584 A1 * | 8/2005 | Plusquellic | 702/117 |

* cited by examiner

*Primary Examiner* — Vincent Q Nguyen
(74) *Attorney, Agent, or Firm* — Sughrue Mion, PLLC

(57) ABSTRACT

A system for inspection of electrical circuits including a calibration subsystem operative to apply a time varying voltage to an electrical circuit being inspected during calibration and to sense differences in an electrical state at various different locations in the electrical circuit being inspected, thereby providing an indication of location of defects therein.

18 Claims, 2 Drawing Sheets

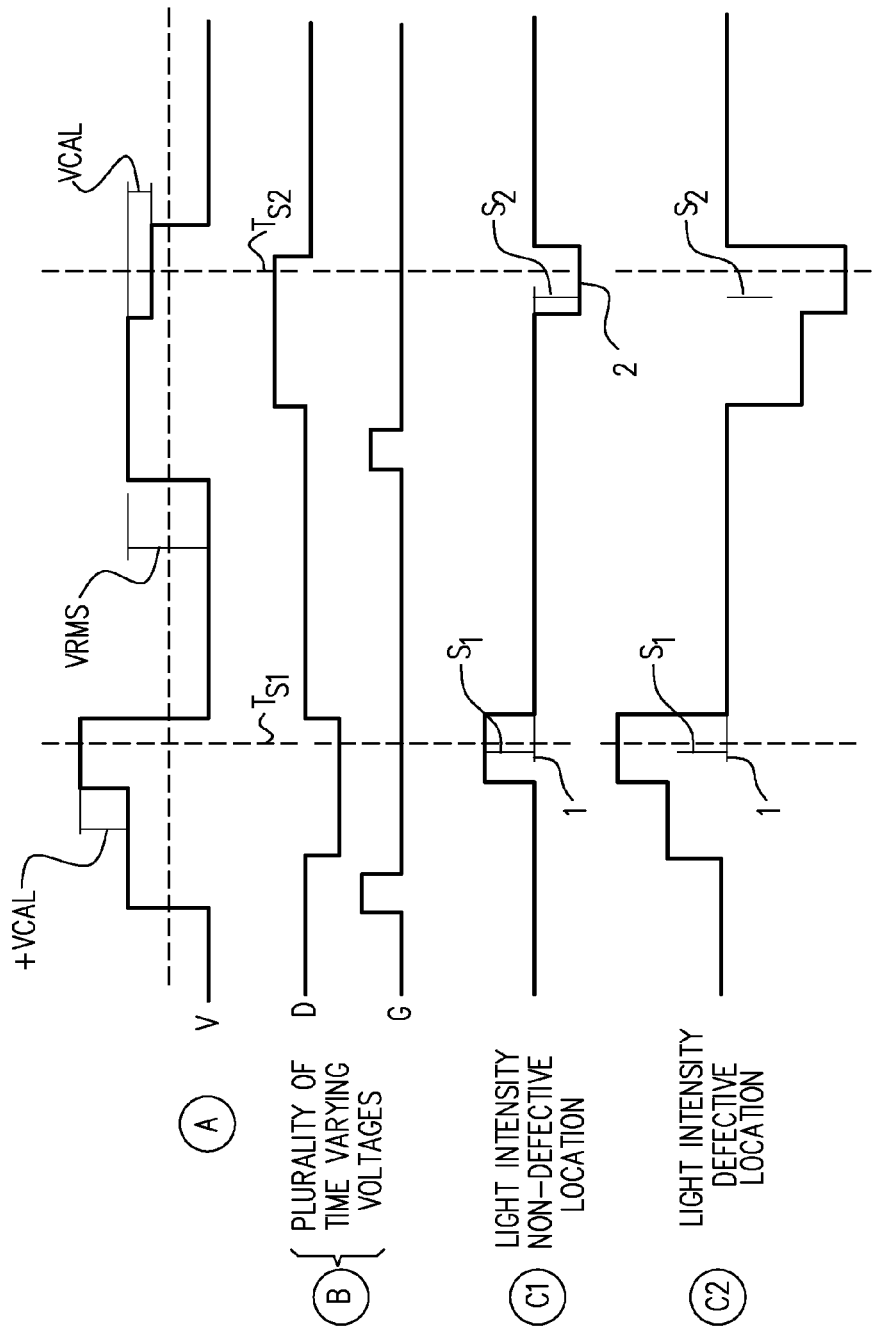

US 8,773,140 B2

SYSTEM AND METHOD FOR INSPECTION OF ELECTRICAL CIRCUITS

FIELD OF THE INVENTION

The present invention relates to automated inspection of electrical circuits generally.

BACKGROUND OF THE INVENTION

The following publications are believed to represent the current state of the art and are hereby incorporated by reference:

U.S. Pat. Nos. 5,124,635; 4,983,911 and 5,124,635.

SUMMARY OF THE INVENTION

The present invention seeks to provide an improved system and method for automated inspection of electrical circuits.

There is thus provided in accordance with a preferred embodiment of the present invention a system for inspection of electrical circuits including a calibration subsystem operative to apply a time varying voltage to an electrical circuit being inspected during calibration and to sense differences in an electrical state at various different locations in the electrical circuit being inspected, thereby providing an indication of location of defects therein.

Preferably, the system for inspection of electrical circuits also includes a modulator having a calibration mode and a defect detection mode and a defect detection subsystem, employing an output of the calibration subsystem, and being operative in the defect detection mode when a desired time varying voltage is being applied to the electrical circuit being inspected. Additionally or alternatively, the calibration subsystem is operative to apply a voltage to plural locations of the electrical circuit being inspected during calibration operation thereof. Alternatively or additionally, the defect detection subsystem includes a camera and is operative to sense light intensity at different locations on the modulator corresponding to the various different locations in the electrical circuit being inspected.

In accordance with a preferred embodiment of the present invention the calibration subsystem is operative to establish a relationship between voltage outputs of the camera and sensed light intensity at the different locations on the modulator. Preferably, the calibration subsystem is operative to provide an indication of location of defects at the different locations on the electrical circuit to be inspected by sensing the light intensities at different locations on the modulator corresponding to the different locations on the electrical circuit when the voltage is applied thereto and by comparing the sensed light intensity at the different locations on the modulator.

There is also provided in accordance with another preferred embodiment of the present invention a method for inspection of electrical circuits, the method including a calibration step including applying a time varying voltage to an electrical circuit being inspected and an inspection step including sensing differences in an electrical state at various different locations in the electrical circuit being inspected, thereby providing an indication of location of defects therein.

Preferably, the inspection step also includes applying a desired time varying voltage to the electrical circuit being inspected. Additionally or alternatively, the calibration step also includes applying a voltage to plural locations of the electrical circuit being inspected.

In accordance with a preferred embodiment of the present invention the inspection step also includes sensing light intensity at different locations on a modulator, the different locations corresponding to the various different locations in the electrical circuit being inspected. Additionally or alternatively, the calibration step includes establishing a relationship between voltage outputs of a camera and sensed light intensity at the different locations on the modulator. Alternatively or additionally, the calibration step includes providing an indication of location of defects at the different locations on the electrical circuit to be inspected by sensing the light intensities at different locations on the modulator corresponding to the different locations on the electrical circuit when the voltage is applied thereto and by comparing the sensed light intensity at the different locations on the modulator.

BRIEF DESCRIPTION OF THE DRAWINGS

The present invention will be understood and appreciated more fully from the following detailed description, taken in conjunction with the drawings in which:

FIG. 2 is a collection of simplified traces illustrating the operation of a preferred embodiment of the present invention.

DETAILED DESCRIPTION OF PREFERRED EMBODIMENT

Figure 1:
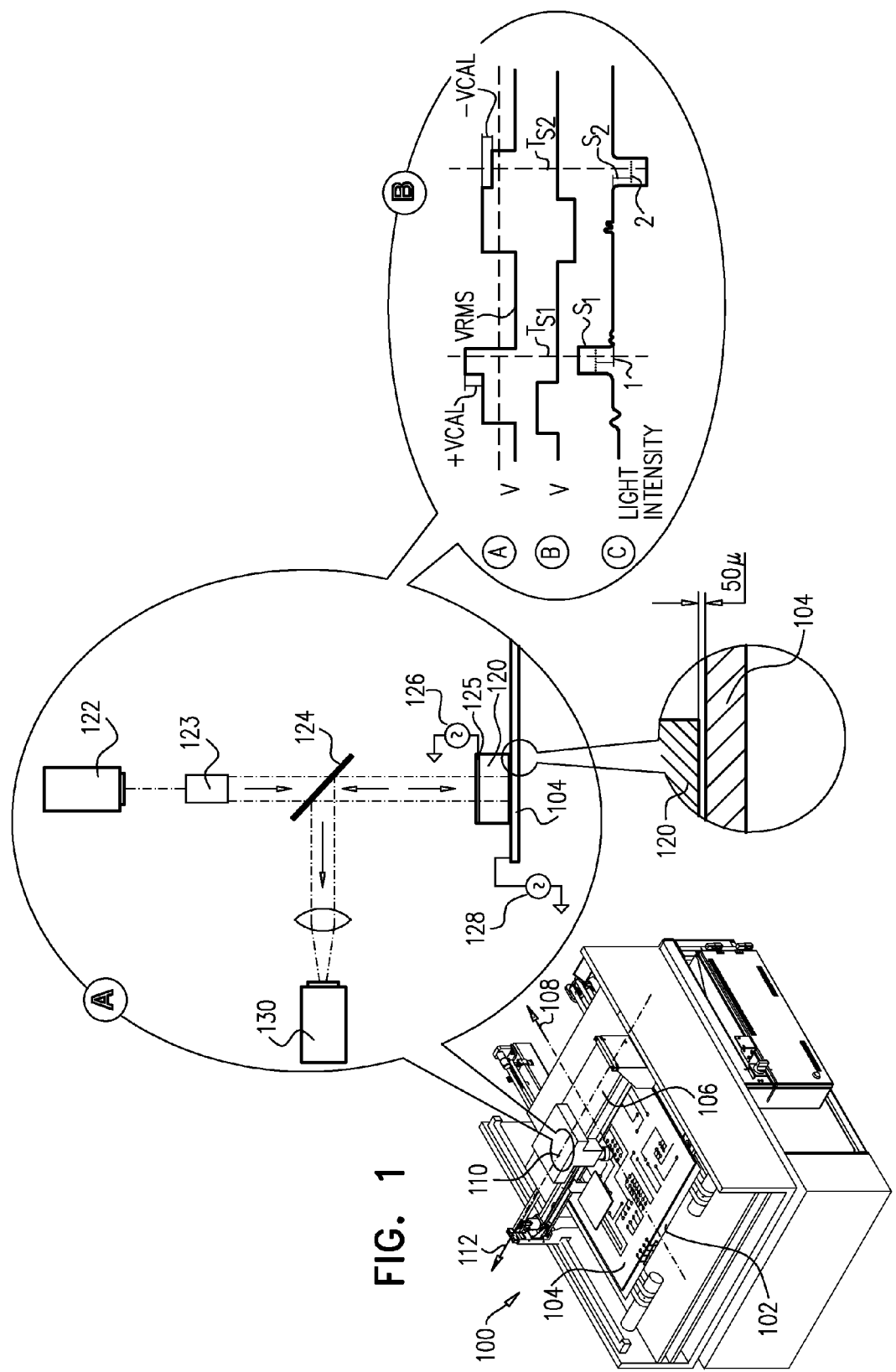
FIG. 1 is a simplified illustration of a system for inspection of electrical circuits constructed and operative in accordance with a preferred embodiment of the present invention.

Reference is now made to FIG. 1, which illustrates a preferred embodiment of a system for inspecting electrical circuits constructed and operative in accordance with a preferred embodiment of the present invention.

As seen in FIG. 1, there is provided a system for inspecting electrical circuits, which is preferably, but not necessarily, based on a chassis 100 of an AC4XXX electrical circuit inspection system, commercially available from Photon Dynamics Inc., of San Jose, Calif., an Orbotech company. Chassis 100 preferably comprises a substrate support assembly 102 which supports an electrical circuit to be inspected (ECTBI) 104, such as a flat panel display substrate. A gantry 106 is selectably positionable along a longitudinal axis 108 with respect to substrate support assembly 102 and with respect to ECTBI 104. An electro-optical inspection assembly 110 is mounted on gantry 106 and is selectably positionable therealong along an axis 112, generally perpendicular to axis 108.

As seen in enlargement A in FIG. 1, the electro-optical inspection assembly 110 preferably includes a modulator 120, such as that described in U.S. Pat. No. 5,124,635, the description of which is hereby incorporated by reference. Modulator 120 is preferably maintained at a fixed distance, typically 50 microns, above ECTBI 104. An illumination source 122, such as a LED array, is positioned to direct optical energy via a beam expander 123 and beam splitter 124 onto modulator 120. A conductive coating 125 of modulator is preferably coupled to a voltage source 126. Various conductors on the ECTBI 104 are preferably coupled to various voltage sources, collectively designated by reference numeral 128. A camera 130 views modulator 120 via beam splitter 124.

An example of a calibration procedure appears in enlargement B in FIG. 1. Trace A shows a voltage in the form of a square wave, which is applied from voltage source 126, producing an RMS voltage designated VRMS. It is appreciated that the source voltage may have any suitable waveform. The voltage VRMS is used to set a bias point relative to which the various voltages are measured. Preferably, the bias point is generally located in a quasi-linear region of a modulation transfer function at a point selected to maximize voltage versus light variation, as described in the aforesaid U.S. Pat. No. 5,124,635.

A secondary calibration voltage +VCAL, a square pulse or other reproducible waveform, is preferably additively combined with the source voltage square wave at a portion of the duty cycle, following the applied square wave voltage and sufficiently ahead of the transition of the square wave voltage, to allow the modulator 120 to settle to a quasisteady state. At a first point in time, designated $T_{S1}$, a sample $S_1$, of the image on the modulator 120 is captured by camera 130. At a subsequent second time $T_{S2}$, when the square wave voltage is either at its nominal value or when it is biased by a second calibration voltage, such as –VCAL, a second sample $S_2$ of the image is captured by camera 130.

The light intensities corresponding to $S_1$ and $S_2$ are compared as a function of the differential of corresponding calibration voltages to determine gain. Gain is a function of distance, voltage, reflection efficiency of the dielectric mirror stack and localized intrinsic gain of the material of the modulator 120. The gain is given by: GAIN=$(\Delta VCAL)/(S_2-S_1)$ at each measurement position.

Image processing can perform this gain calibration function for all points simultaneously on a captured image. Thereafter, any voltage can be quantified by measurement of a differential voltage relative to VRMS, which is the bias point BP.

It is appreciated that measurements relative to the bias point may be made by consecutive samples of the light intensity. There is first a sampling of the light intensity at the first point in time to obtain a sample $S_1$ while the bias source is at a (positive) stable voltage and an excitation voltage source applying a voltage across the ECTBI 104 is at a (positive) stable voltage. There follows a sampling of the light intensity at the second time to obtain a sample $S_2$ while the bias source is at a (positive) stable voltage and the excitation voltage source applying a voltage across the ECTBI 104 is at a (negative) stable voltage. The differential between the voltages applied through the bias source and the excitation voltage source is $\Delta V_1$ at the first point in time and $\Delta V_2$ at the second time.

The unknown voltage, namely, the measured voltage at an arbitrary panel pixel XY, or $\Delta V_{1-2}$=GAIN $(S_2-S_1)$. This differential, to a first order, eliminates offset errors. Where one of the sample measurements is relative to a circuit ground, measured voltage will be equal to the unknown voltage.

The distance between modulator 120 and ECTBI 104 is controlled, preferably being as close as practical without causing side effects, such as shorts, thermal transfer or mechanical distortion due to stress. The selection of the distance is made to maximize the ratio of signal to noise, particularly noise attributable to cross-talk from electric fields produced by adjacent points of voltage. A working rule, applicable particularly to LCD panels wherein the source of voltage is an area defined as a pixel area, is to place the modulator 120 relative to the ECTBI 104 so that the distance between modulator 120 and ECTBI 104 is less than the distance between different locations on the ECTBI 104 being inspected and preferably no more than 30% of the diameter of the pixel area.

It is a particular feature of the present invention that, as seen in trace B, a time varying voltage is applied to at least one location on ECTBI 104 during calibration and prior to image capture by camera 130. Defective locations on ECTBI 104 respond differently to this time varying voltage than do non-defective locations. These responses are sensed as different light intensities reflected by the modulator at locations corresponding to respective defective and non-defective locations on ECTBI 104. As a result, the calculated gain for defective and non-defective locations differs to a degree greater than in the prior art represented by U.S. Pat. No. 5,124,635 in which no time varying voltage is applied to ECTBI 104 during calibration.

This can be seen from a consideration of trace C of FIG. 1 in which the light intensity produced by a defective location on ECTBI 104 in accordance with the present invention is shown in a solid line, while the light intensity produced at a defective location in accordance with the prior art is shown in a dashed line.

It is appreciated that the present invention thus provides a significantly enhanced signal to noise ratio and thus significantly enhanced detection sensitivity and thus enhanced detection performance.

Reference is now made to FIG. 2, which is a collection of traces corresponding generally to traces A, B and C in FIG. 1. In FIG. 2, trace A may be identical to that in FIG. 1. In FIG. 2, trace B is shown to include application of time varying voltages to different conductors on the ECTBI, for example the Data (D) and Gate (G) conductors in a LCD flat panel display. In FIG. 2, trace C1 illustrates the response of a non-defective location on the ECTBI to the applied time varying voltages, where the location, such as a pixel, holds its voltage. Trace C2 illustrates the response of a defective location on the ECTBI to the applied time varying voltages. It is appreciated from a consideration of Trace C2 that a defective location is leaked up in accordance with the polarity of the applied voltage where the location, such as a pixel, fails to hold its voltage.

The light intensity values for each location appearing in traces C1 and C2 are preferably expressed as gain for each location and are employed for reporting the defect locations. Such reports may advantageously be employed for guiding repair functionality.

It will be appreciated by persons skilled in the art that the present invention is not limited to what has been particularly shown and described hereinabove. Rather the scope of the present invention includes both combinations and sub-combinations of the features described hereinabove as well as modifications and variations thereof which are not in the prior art.

The invention claimed is:

1. A system for inspection of electrical circuits comprising:
a calibration subsystem operative to apply a time varying voltage to an electrical circuit being inspected during calibration and to sense differences in an electrical state at various different locations in the electrical circuit being inspected, thereby providing an indication of location of defects therein;
a modulator having a calibration mode and a defect detection mode and being operative in said defect detection mode when a desired time varying voltage is being applied to the electrical circuit being inspected; and
a defect detection subsystem, employing an output of said calibration subsystem,
said calibration subsystem being operative to apply a voltage to plural locations of said electrical circuit being inspected during calibration operation thereof.

2. A system for inspection of electrical circuits according to claim 1 and wherein said defect detection subsystem includes a camera and is operative to sense light intensity at different locations on said modulator corresponding to said various different locations in the electrical circuit being inspected.

3. A system for inspection of electrical circuits according to claim 2 and wherein said calibration subsystem is operative to establish a relationship between voltage outputs of said camera and sensed light intensity at said different locations on said modulator.

4. A system for inspection of electrical circuits according to claim 1 and wherein said calibration subsystem is operative to provide an indication of location of defects at said different locations on said electrical circuit to be inspected by sensing the light intensities at different locations on the modulator corresponding to said different locations on said electrical circuit when said voltage is applied thereto and by comparing the sensed light intensity at said different locations on said modulator.

5. A system for inspection of electrical circuits comprising:
a calibration subsystem operative to apply a time varying voltage to an electrical circuit being inspected during calibration and to sense differences in an electrical state at various different locations in the electrical circuit being inspected, thereby providing an indication of location of defects therein;
a modulator having a calibration mode and a defect detection mode and being operative in said defect detection mode when a desired time varying voltage is being applied to the electrical circuit being inspected; and
a defect detection subsystem, employing an output of said calibration subsystem,
said defect detection subsystem including a camera and being operative to sense light intensity at different locations on said modulator corresponding to said various different locations in the electrical circuit being inspected.

6. A system for inspection of electrical circuits according to claim 5 and wherein said calibration subsystem is operative to establish a relationship between voltage outputs of said camera and sensed light intensity at said different locations on said modulator.

7. A system for inspection of electrical circuits according to claim 5 and wherein said calibration subsystem is operative to provide an indication of location of defects at said different locations on said electrical circuit to be inspected by sensing the light intensities at different locations on the modulator corresponding to said different locations on said electrical circuit when said voltage is applied thereto and by comparing the sensed light intensity at said different locations on said modulator.

8. A system for inspection of electrical circuits comprising:
a calibration subsystem operative to apply a time varying voltage to an electrical circuit being inspected during calibration and to sense differences in an electrical state at various different locations in the electrical circuit being inspected, thereby providing an indication of location of defects therein;
a modulator having a calibration mode and a defect detection mode and being operative in said defect detection mode when a desired time varying voltage is being applied to the electrical circuit being inspected; and
a defect detection subsystem, employing an output of said calibration subsystem,
said calibration subsystem being operative to provide an indication of location of defects at said different locations on said electrical circuit to be inspected by sensing the light intensities at different locations on the modulator corresponding to said different locations on said electrical circuit when said voltage is applied thereto and by comparing the sensed light intensity at said different locations on said modulator.

9. A system for inspection of electrical circuits comprising:
a calibration subsystem operative to apply a time varying voltage to an electrical circuit being inspected during calibration and to sense differences in an electrical state at various different locations in the electrical circuit being inspected, thereby providing an indication of location of defects therein;
said calibration subsystem being operative to apply a voltage to plural locations of said electrical circuit being inspected during calibration operation thereof, and said calibration subsystem being operative to provide an indication of location of defects at said different locations on said electrical circuit to be inspected by sensing the light intensities at different locations on a modulator corresponding to said different locations on said electrical circuit when said voltage is applied thereto and by comparing the sensed light intensity at said different locations on said modulator.

10. A method for inspection of electrical circuits, the method comprising:
a calibration step including:
applying a time varying voltage to an electrical circuit being inspected; and
applying a voltage to plural locations of said electrical circuit being inspected; and
an inspection step including:
sensing differences in an electrical state at various different locations in the electrical circuit being inspected, thereby providing an indication of location of defects therein: and
said inspection step also comprises sensing light intensity at different locations on a modulator, said different locations corresponding to said various different locations in the electrical circuit being inspected.

11. A method for inspection of electrical circuits according to claim 10, and wherein said inspection step also comprises applying a desired time varying voltage to the electrical circuit being inspected.

12. A method for inspection of electrical circuits according to claim 10 and wherein said calibration step comprises establishing a relationship between voltage outputs of a camera and sensed light intensity at said different locations on said modulator.

13. A method for inspection of electrical circuits according to claim 10 and wherein said calibration step comprises providing an indication of location of defects at said different locations on said electrical circuit to be inspected by sensing the light intensities at different locations on the modulator corresponding to said different locations on said electrical circuit when said voltage is applied thereto and by comparing the sensed light intensity at said different locations on said modulator.

14. A method for inspection of electrical circuits, the method comprising:
a calibration step including applying a time varying voltage to an electrical circuit being inspected; and
an inspection step including:
sensing differences in an electrical state at various different locations in the electrical circuit being inspected, thereby providing an indication of location of defects therein;
applying a desired time varying voltage to the electrical circuit being inspected; and sensing light intensity at different locations on a modulator, said different locations corresponding to said various different locations in the electrical circuit being inspected.

15. A method for inspection of electrical circuits according to claim 14 and wherein said calibration step comprises establishing a relationship between voltage outputs of a camera and sensed light intensity at said different locations on said modulator.

16. A method for inspection of electrical circuits according to claim 14 and wherein said calibration step comprises providing an indication of location of defects at said different locations on said electrical circuit to be inspected by sensing the light intensities at different locations on the modulator corresponding to said different locations on said electrical circuit when said voltage is applied thereto and by comparing the sensed light intensity at said different locations on said modulator.

17. A method for inspection of electrical circuits, the method comprising:
  a calibration step including:
    applying a time varying voltage to an electrical circuit being inspected; and
    providing an indication of location of defects at said different locations on said electrical circuit to be inspected by sensing the light intensities at different locations on a modulator, said different locations on a modulator corresponding to said different locations on said electrical circuit when said voltage is applied thereto and by comparing the sensed light intensity at said different locations on said modulator; and
  an inspection step including:
    sensing differences in an electrical state at various different locations in the electrical circuit being inspected, thereby providing an indication of location of defects therein; and
    applying a desired time varying voltage to the electrical circuit being inspected.

18. A method for inspection of electrical circuits, the method comprising:
  a calibration step including:
    applying a time varying voltage to an electrical circuit being inspected; and
    applying a voltage to plural locations of said electrical circuit being inspected; and
  an inspection step including:
    sensing differences in an electrical state at various different locations in the electrical circuit being inspected, thereby providing an indication of location of defects therein; and
    providing an indication of location of defects at said different locations on said electrical circuit to be inspected by sensing the light intensities at different locations on a modulator, said different location on a modulator corresponding to said different locations on said electrical circuit when said voltage is applied thereto and by comparing the sensed light intensity at said different locations on said modulator.

* * * * *